United States Patent [19]

Lewin et al.

[11] Patent Number: 4,502,094
[45] Date of Patent: Feb. 26, 1985

[54] ELECTROSTATIC CHUCK

[75] Inventors: Ian H. Lewin, Forest Row; Michael J. Plummer, Redhill; Rodney Ward, Crawley, all of England

[73] Assignee: U.S. Philips Corporation, New York, N.Y.

[21] Appl. No.: 416,723

[22] Filed: Sep. 10, 1982

[30] Foreign Application Priority Data

Sep. 14, 1981 [GB] United Kingdom ............... 8127638

[51] Int. Cl.³ .............................................. H01F 13/00
[52] U.S. Cl. ..................................... 361/234; 269/8; 269/903
[58] Field of Search ................... 361/234, 145; 269/8, 269/903

[56] References Cited

U.S. PATENT DOCUMENTS 4,384,918  5/1983  Abe ................................ 361/234 X

FOREIGN PATENT DOCUMENTS 1443215  7/1976  United Kingdom .

Primary Examiner—Reinhard J. Eisenzopf
Attorney, Agent, or Firm—Robert T. Mayer; Bernard Franzblau

[57] ABSTRACT

An electrostatic chuck for holding a simiconductor wafer flat in a charged particle beam machine has thermally conductive portions for supporting the wafer. An electrically conductive member, for example a grid, has parts which extend between the thermally-conductive portions and is separated from the wafer by a dielectric layer. The wafer is clamped against the chuck by the electrostatic force set up across the dielectric layer when a potential difference is applied between the conductive wafer and the conductive member. Heat generated in the wafer by the bombardment of charged particles can be dissipated readily via the thermally conductive portions. The wafer can be electrically contacted at its back surface if the portions are also electrically conductive. To enhance thermal conduction away from the wafer, the conductive portions can protrude from the dielectric layer.

13 Claims, 3 Drawing Figures

ELECTROSTATIC CHUCK

BACKGROUND OF THE INVENTION

This invention relates to an electrostatic chuck for holding a semiconductor wafer in a fixed plane relative to said chuck, which chuck comprises an electrically conductive member separated from said fixed plane by a layer of dielectric material, means for electrically contacting the wafer, and means for supporting the wafer in said plane.

In the manufacture of semiconductor devices it is sometimes necessary to clamp a semiconductor wafer substantially flat against a support so that one of its surfaces can be subjected to a processing treatment. Such a treatment may involve directing charged particles towards the wafer. For example, selected areas of the wafer can have their conductivity type modified by the implantation of ions. As another example, an electron sensitive resist may be coated on the wafer surface and the resist can then be selectively exposed to a beam of electrons. During these processing treatments it is important that the wafer be held flat against the support. For this purpose it is known to use a so-called electrostatic chuck.

United Kingdom Patent Specification GB No. 1,443,215 describes an electrostatic chuck which essentially comprises a substantially flat electrically conductive support member coated with a layer of dielectric material. A semiconductor wafer can be supported on the dielectric layer which thus prevents physical and electrical contact between the facing surfaces of the wafer and the support. The chuck also has means for electrically contacting the wafer so that a potential difference can be applied between the wafer and the support. Such a potential difference sets up an electrostatic clamping force across the dielectric layer so that the wafer is then held substantially flat against the dielectric layer. With the wafer thus clamped, its surface remote from the support can be subjected to the appropriate processing treatment.

Unfortunately, processing treatments involving the use of beams of charged particles as mentioned above are responsible for the generation of thermal energy in the wafer. This thermal energy can cause expansion and local distortion of the wafer if the heat generated cannot be readily dissipated. The chuck described in GB No. 1,443,215 relies on firm and even clamping of the wafer to obtain good heat exchange between the wafer and the support. However, the wafer is actually clamped against the dielectric layer which separates the wafer from the support. In general, the thermal conductivity of dielectric materials is not particularly high. Thus the dielectric layer, which is necessary for electrostatic attraction, acts as a barrier to the efficient flow of heat from the wafer to the support so that it is necessary to use thin layers of high thermal conductivity dielectric in order to obtain adequate heat conduction. It can be said, therefore, that for adequate clamping and good heat transfer between the wafer and the support, the chuck described in GB No. 1,443,215 must have a thin layer of high thermal conductivity dielectric material with a high dielectric constant and a high dielectric strength. Clearly the choice of materials and design flexibility is severely restricted by these requirements.

SUMMARY OF THE INVENTION

According to the present invention, an electrostatic chuck having the features mentioned above is characterized in that it further comprises thermally conductive portions for contacting the wafer, and in that the electrically conductive member has parts which extend laterally between said thermally conductive portions, the dielectric layer extending at least on said parts.

Thus, when a wafer is located on an electrostatic chuck in accordance with the invention it contacts the thermally conductive portions. When a potential difference is applied between the wafer and the electrically conductive member the wafer is pulled by electrostatic attraction against the thermally conductive portions so that heat can flow freely away from the wafer.

Because the wafer contacts the thermally conductive portions there is a relaxation of the requirements for the dielectric layer. First, there is no longer any need for it to have such a high thermal conductivity, and second, it is not necessary to use such thin dielectric layers. This allows a much wider choice of dielectric materials than was possible in the prior art chuck described above. Also, there is an increased freedom of chuck design resulting from less stringent requirements for the thickness of the dielectric layer.

It is preferable for the thermally conductive portions to be sufficiently rigid so that they can support the semiconductor wafer in a fixed plane. This eliminates the need for separate members to support the wafer, thus simplifying chuck design and manufacture.

The effectiveness of heat flow away from the semiconductor wafer can be enhanced by the provision of a heat sink which can be constituted by a thermally conductive support having a periphery in thermal contact with the thermally conductive portions.

The thermally conductive portions may themselves be electrically conductive. In this case the thermally conductive portions are electrically isolated from the electrically conductive member. As the thermally conductive portions support the semiconductor wafer it is electrically contacted by them so that the thermally conductive portions also constitute the electrical contact means for the wafer. Thus the wafer is electrically contacted at the back surface (i.e. the surface opposite that which is to be subjected to the processing treatment) without the need for any additional contact means. In contrast, the known chuck mentioned above employs special contact means in the form of a metal block having a V-shaped recess. The semiconductor wafer can be located such that it abuts the edge of this recess thereby making electrical contact with the edge of the wafer.

In one form of a chuck in accordance with the invention, the thermally conductive portions protrude beyond the dielectric layer so that the dielectric is spaced apart from the fixed plane. When a semiconductor wafer is located on such a chuck there is no physical contact between the wafer and the dielectric. An advantage of this is that it maximizes the contact pressure between the wafer and the thermally conductive portions for optimum heat transfer. A further advantage is that any small particles of debris which may be present at the area of the chuck where the wafer is to be clamped tend to be attracted onto the dielectric. Because the thermally conductive portions supporting the wafer protrude beyond the dielectric layer, the wafer is held away from any such debris so that the flatness of the wafer is not affected. With the known chuck described above the surface (i.e. the dielectric layer) against which the semiconductor wafer is electrostatically attracted is substantially flat so that the presence of any particles of debris would tend to cause localized bowing of the wafer, which is most undesirable.

The thermally conductive portions may be pillars having flat end faces for supporting the semiconductor wafer in a fixed plane relative to the chuck. The conductive member can then be a grid, where the conductive pillars extend through the meshes of said grids.

Alternatively, the thermally conductive portions may be constituted by a thermally conductive grid. The electrically conductive member then has parts which extend between the meshes of this grid. The number of constituent parts of such a chuck is minimized when the electrically conductive member comprises a plate which is integral with the parts which extend into the meshes of the grid. By minimizing the number of constituent parts, manufacture of such an electrostatic chuck can be simplified.

Both of these gridded structures are compatible with known X-ray alignment techniques which require holes to be provided all the way through the chuck. When the conductive member is in the form of a grid these holes can be provided merely by omitting conductive pillars from appropriately located meshes in the grid. Alternatively, when the thermally conductive portions are in the form of a grid the holes can be provided as appropriately located apertures in the electrically conductive member, each of these apertures being aligned with a mesh of the grid.

BRIEF DESCRIPTION OF THE DRAWING

Embodiments of the invention will now be described, by way of example, with reference to the accompanying drawings, in which.

It should be noted that, for the sake of clarity, the Figures are not drawn to scale.

DESCRIPTION OF THE PREFERRED EMBODIMENTS

Figure 1:
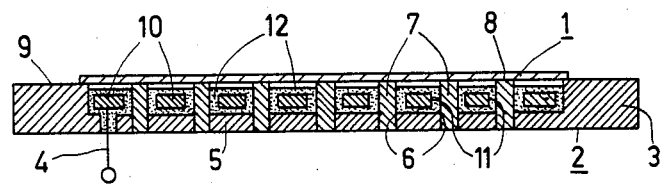
FIG. 1 is a cross-sectional view, taken on the line I—I' of FIG. 2, of a semiconductor wafer located on an electrostatic chuck in accordance with the invention.
Figure 2:
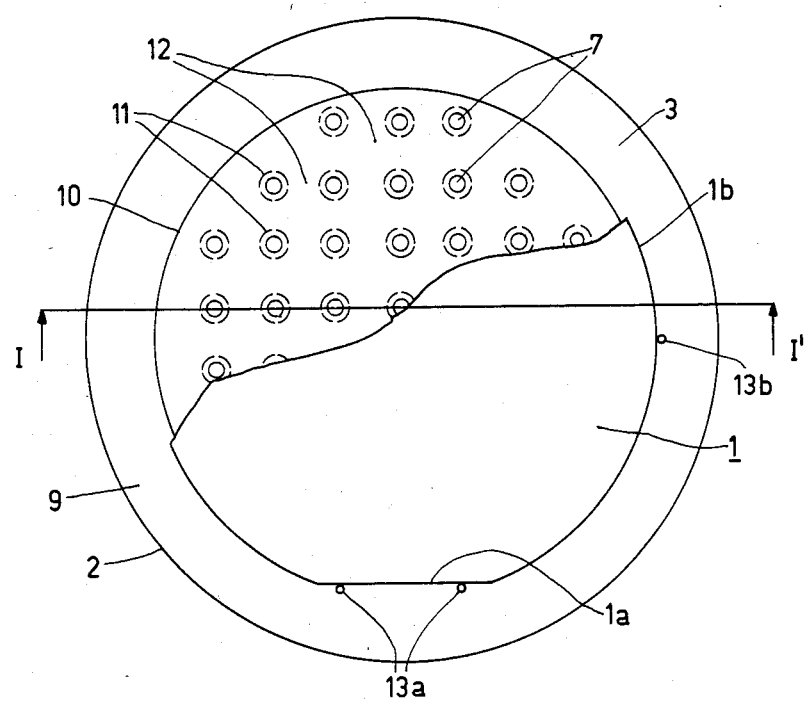
FIG. 2 is a plan view, taken from above, of the semiconductor wafer and the chuck of FIG. 1, the semiconductor wafer being partially cut away.

FIGS. 1 and 2 show a semiconductor wafer 1 located on an electrostatic chuck 2 which comprises a thermally conductive support 3,5 made of, for example, aluminum. For positioning the wafer 1 on the chuck, locating pins 13a, 13b are provided so that the flat edge 1a of wafer 1 can abut pins 13a and the rounded edge 1b abuts pin 13b so that the location of the wafer 1 is uniquely defined. The support has a peripheral portion 3 which may be 6 mm. thick and a thinner, perforated central portion 5 having a thickness of approximately 3.5 mm. The central portion 5 has perforations or apertures 6 which are circular in cross-section with a diameter of 3 mm. The electrostatic chuck also comprises thermally conductive portions in the form of copper pillars 7 which are secured in the apertures 6. The pillars 7, which are 6 mm. long and have a diameter of 3 mm., are in thermal contact with the central portion 5 of the support and also with the peripheral portion 3 which, because of its relatively large size, can act as a heat sink.

The pillars 7 have flat end faces 8 which lie in the same fixed plane so that the semiconductor wafer 1 can bear on them as well as on the major surface 9 of the peripheral portion 3 of the support. In this way the wafer can be supported in a fixed plane relative to the electrostatic chuck 2. Moreover, because the pillars 7 are made of metal they are electrically (as well as thermally) conductive so that the semiconductor wafer 1 is electrically contacted at its back surface (i.e. the surface facing the electrostatic chuck 2) by the pillars 7.

The chuck 2 also has an electrically conductive member in the form of a grid electrode 10 which may be made of, for example, aluminum. Essentially the grid 10 is circular, having a diameter of 90 mm. and a thickness of 1.3 mm. The meshes of the grid 10 are constituted by circular apertures 11 which have a diameter of 5 mm. The grid 10 has parts which extend between the pillars 7 because it is located such that the pillars 7 extend through the apertures 11, but the pillars 7 and grid 10 are mutually insulated by a layer of dielectric material 12. The layer 12 of dielectric material which may be, for example, an epoxy resin surrounds the grid 10 so that, in addition to insulating the grid from the pillars 7 the grid 10 is also insulated from the central portion 5 of the support. The separation of the grid 10 from both the pillars 7 and the central portion 5 of support 2 is, for example, 1 mm., the dielectric layer 10 filling the whole space between these various members. In addition the dielectric layer is present on the upper surface of grid 10 but this part of layer 10 has a thickness of approximately 200 micrometers. As explained in more detail hereinafter the pillars 7 may protrude from the dielectric layer 12 so that the semiconductor wafer 1 is spaced apart from layer 12 by approximately 10 micrometers.

The use of a transparent epoxy resin for the dielectric layer 12 is particularly advantageous because any major defects in the dielectric layer 12 can be detected visually before the chuck is actually used. The offending part of the dielectric layer can then be removed, e.g. by drilling, and replaced with fresh material.

To hold the semiconductor wafer 1 against the chuck 2 a potential difference is applied between the wafer 1 and the grid electrode 10. Typically this potential difference is 4 kV. Electrical contact is made to the back surface of wafer 1 via pillars 7 from the support 2 and a bias potential of, for example, approximately 4 kV is applied to grid 10 via an electrical connection 4 extending through the central portion 5 of the support and through the dielectric layer 12. Thus an electrostatic clamping force is established across the dielectric layer 12 so that the wafer 1 is held in a fixed plane against the pillars 7 of the chuck 2. The magnitude of the clamping force is proportional to the square of the potential difference between wafer 1 and electrode 10, directly proportional to the dielectric constant of layer 12, and inversely proportional to the square of the distance between the wafer 1 and the grid 10. For an epoxy resin with a dielectric constant of approximately 4 and when the thickness of the dielectric layer 12 is about 200 micrometers, the clamping force per unit area is approximately $5 \times 10^4$ Nm$^{-2}$. The chuck may have a total of 55 pillars 7 over an area of 50 cm$^2$. (For the sake of clarity not all of these pillars are shown in FIG. 2).

As shown in FIG. 2 the chuck 2 has a symmetrical distribution of pillars 7. In order that the wafer is held evenly against the chuck it is preferable that the pillars 7 are relatively closely spaced to avoid localized bowing of the wafer. This is also consistent with the need to avoid temperature variations across the wafer 1. The greater the number of pillars 7 and the closer is their spacing the more efficient can be the transfer of heat from the wafer to the thick peripheral heat sink 3 of the support. But, as far as the number of pillars is concerned, a compromise has to be reached because the contact pressure due to electrostatic attraction is reduced as the number of pillars 7 is increased. However, because the pillars 7 protrude from dielectric layer 12, the wafer 1 contacts the chuck 2 only at the end faces 8 of the pillars 7 and at the inner periphery of the major surface 9. By limiting the contact area in this way the contact pressure (i.e. force per unit area) is maximized. This is beneficial because the efficiency of heat transfer between the wafer 1 and the pillars 7 depends on the contact pressure.

As mentioned previously, there is another advantage attaching to the fact that the pillars 7 protrude from the dielectric layer, namely that any small particles of debris which may be present at the area of the chuck 2 where the wafer 1 is to be clamped tend to be attracted onto the dielectric layer 12. Because the wafer 1 is spaced apart from layer 12 it is also held away from any such particles of debris so that the flatness of the wafer is not affected.

Once the potential difference is applied between the wafer 1 and the grid 10, as mentioned above, the front surface of the semiconductor wafer (i.e. the surface directed away from the chuck 2) can be subjected to the appropriate processing treatment. For example, a layer of electron sensitive resist (not shown in the Figures) present on the front surface of the wafer 1 may be exposed to a beam of electrons to define a pattern in the resist. The impinging electrons cause heat to be generated in the semiconductor wafer. This heat can readily flow away from the wafer through pillars 7 to the thick peripheral portion 5 of the support, which thus acts as a heat sink.

The chuck described above can be made in a relatively straightforward manner as follows. The support is made from a 6 mm. thick circular block of aluminum which is machined to form the thinner central portion 5 of the support. For use with 100 mm. semiconductor wafers this central portion may have a diameter of 95 mm. and the diameter of the whole support may be 150 mm. The central well in the support is filled with an epoxy resin which is then machined down to a thickness of approximately 1 mm. Next, the apertures 6 are formed by drilling through the central portion 5 of the support and through the epoxy resin. At this stage also a hole is drilled to accommodate the electrical connection 4. The pillars 7 are then pressed into the apertures 6 after which the grid 10 is provided so that the pillars 7 extend through the meshes 11 as described above. Epoxy resin is provided around and above the grid 10 to form the dielectric layer 12 which can then be cut back so that the pillars 7 protrude from it. Alternatively, the pillars 7 can be gold-plated in a conventional manner. The thickness of this plating is approximately 10 micrometers. The chuck is completed by screwing locating pins into appropriate locations on the peripheral portion 3 of the support and providing the electrical connection 4 which is insulated from the central portion 5 of the support.

Figure 3:
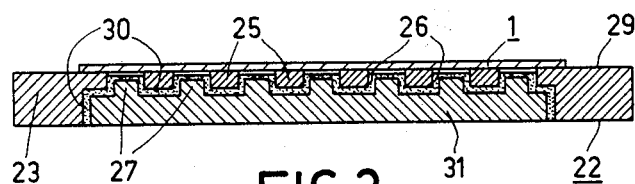
FIG. 3 is a cross-sectional view of a semiconductor wafer on a different embodiment of an electrostatic chuck in accordance with the invention.

A different embodiment of an electrostatic chuck in accordance with the invention will now be described with reference to FIG. 3. As before, this chuck 22 comprises a thermally conductive support made of, for example, aluminum. The support again has a thick peripheral portion 23 which may be 6 mm. thick and a thinner, perforated central portion 25 having a thickness of for example 3 mm. The central portion has apertures 26 which may be circular in cross-section with a diameter of 10 mm. The central portion 25 is thus in the form of a grid which constitutes the thermally conductive portions for supporting a semiconductor wafer 1. The grid 25 is integral with the peripheral portion 23 of support 22 so that heat can be transferred readily from the semiconductor wafer to this peripheral portion 23 which again acts as a heat sink.

The chuck also comprises a plurality of electrically conductive parts 27 which extend into the meshes i.e. the apertures 26 but are insulated therefrom by a dielectric layer 30 which again may be an epoxy resin. The parts 27 are integral with an electrically conductive plate 31 which, like the members 27, may be made of aluminum. This plate 31 is also insulated from the support 22 by dielectric layer 30. As in the previous embodiment the thermally conductive portions for supporting the wafer, that is to say the grid 25, protrude from the dielectric layer 30. The wafer 1 is electrostatically clamped in a fixed plane relative to the chuck by applying a potential difference between the wafer 1 and the electrically conductive member constituted by parts 27 and plate 31. As before the thermally conductive portions, i.e. grid 25, also serve as electrical contacts for the back surface of the semiconductor wafer 1 so that an electric potential can be applied to the wafer 1 simply by applying a potential to the support 22. An electric potential can be applied directly to plate 31 to set up the required potential difference.

To make this chuck 22, the starting material is again a circular slab of, for example, aluminum having the same dimensions as before. The central thinner portion is formed by machining, after which the apertures 26 are formed by drilling or etching. Thus the central portion 25 of the support takes on the form of a grid. The support can then be rested on a flat surface with the grid engaging that surface. In other words the support 22 is inverted with respect to its position shown in FIG. 3. A layer of dielectric material 30, for example an epoxy resin, is provided on the whole of the upper exposed surface of the support and on the exposed parts of the flat surface on which the support bears. After removing the chuck from the flat surface on which it is resting the electrically conductive member in the form of members 27 integral with plate 31 is pressed into the insulating layer 30 such that this layer 30 has a thickness between the members 27 and the flat surface of about 200 micrometers. The insulating layer is then machined flat so that it does not protrude above the surface 29 of the support 22, after which this surface 29 can be gold-plated in conventional manner so that it protrudes about 10 micrometers from the dielectric layer 30. As an alternative to plating the surface 29, the dielectric layer 30 can be cut back to achieve the same effect. In either case when a semiconductor wafer 1 is located on the chuck 22 it is supported by the grid 25 and the peripheral portion 23 of support 22 so that the wafer 1 is spaced apart from the dielectric layer 30. In order that the wafer can be correctly located on the chuck 22 three locating pins are provided as in the previous embodiment.

The invention is not limited to the particlar embodiments described above. To the contrary, many modifications are possible within the scope of the invention. For example different materials may be used for the different elements of the electrostatic chuck. In this context it is noted that the thermally conductive portions, that is to say the pillars 7 in the first embodiment and the grid 25 in the second embodiment, may be made of a material which is thermally but not electrically conductive. In this case it would be necessary to provide other electrical contact means for example a recessed metal block on the front surface (9,29) of the chuck for electrically contacting the semiconductor wafer.

Also, it is noted that it is not necessary for the thermally conductive portions to protrude from the dielectric layer. Instead, the dielectric layer may be co-planar with the upper surfaces of the thermally conductive members. Nor is it necessary for the dielectric layer to fill completely the space between the electrically conductive member and the other parts of the chuck. Thus, for example, the dielectric layer may fill only part of the space separating the thermally conductive portions from the electrically conductive member. Alternatively, this space may even be filled with an electrically insulating material different to that of the dielectric layer.

We claim:

1. An electrostatic chuck for holding a semiconductor wafer in a fixed plane relative to said chuck, which chuck comprises an electrically conductive member separated from said fixed plane by a layer of dielectric material, means for electrically contacting the wafer, and means for supporting the wafer in said plane, including thermally conductive portions for contacting the wafer, the electrically conductive member comprising parts which extend laterally between said thermally conductive portions, and the dielectric layer extending at least on said parts.

2. An electrostatic chuck as claimed in claim 1, further comprising a thermally conductive support having a periphery in thermal contact with the thermally conductive portions.

3. An electrostatic chuck as claimed in claim 2, characterized in that the thermally conductive portions are pillars having flat end faces which lie in the fixed plane.

4. An electrostatic chuck as claimed in claim 3, characterized in that the electrically conductive member is a grid, the conductive pillars extending through the meshes of said grid.

5. An electrostatic chuck as claimed in claim 3 or 4, characterized in that the support has a perforated central portion which is thinner than the periphery, the thermally conductive pillars being secured in the perforations.

6. An electrostatic chuck as claimed in claim 2, characterized in that the thermally conductive portions comprise a thermally conductive grid, the electrically conductive member having parts which extend between the meshes of said grid.

7. An electrostatic chuck as claimed in claim 6, characterized in that the electrically conductive member comprises a plate which is integral with said parts which extend between the meshes of the grid.

8. An electrostatic chuck as claimed in claim 6 or 7, characterized in that the thermally conductive grid forms the central part of the support and is integral with the periphery of said support.

9. An electrostatic chuck as claimed in claim 2, characterized in that the thermally conductive periphery has a major surface coincident with the fixed plane.

10. An electrostatic chuck as claimed in claim 1, 2 or 3, characterized in that the thermally conductive portions are also electrically conductive and comprise the electrical contact means for the wafer, said thermally conductive members being electrically isolated from the electrically conductive member.

11. An electrostatic chuck as claimed in claim 10, characterized in that the thermally conductive portions are electrically isolated from the electrically conductive member by the layer of dielectric material.

12. An electrostatic chuck as claimed in claim 1, 2 or 9, characterized in that the dielectric material is transparent.

13. An electrostatic chuck as claimed in claim 1, 2 or 9, characterized in that the thermally conductive portions protrude from the dielectric layer so that the dielectric is spaced apart from said fixed plane.

* * * * *